US012216449B1

(12) United States Patent
Rubinfeld

(10) Patent No.: US 12,216,449 B1
(45) Date of Patent: Feb. 4, 2025

(54) CUSTOM EYEWEAR MANUFACTURING SYSTEM

(71) Applicant: Eric Rubinfeld, Yonkers, NY (US)

(72) Inventor: Eric Rubinfeld, Yonkers, NY (US)

( * ) Notice: Subject to any disclaimer, the term of this patent is extended or adjusted under 35 U.S.C. 154(b) by 0 days.

(21) Appl. No.: 18/806,345

(22) Filed: Aug. 15, 2024

(51) Int. Cl.
*G05B 19/4097* (2006.01)
*G06F 30/17* (2020.01)

(52) U.S. Cl.
CPC ......... *G05B 19/4097* (2013.01); *G06F 30/17* (2020.01); *G05B 2219/45175* (2013.01)

(58) Field of Classification Search
CPC ...... G05B 19/4097; G05B 2219/45175; G06F 30/17
USPC ......................................................... 700/103
See application file for complete search history.

(56) References Cited

U.S. PATENT DOCUMENTS

| | | | | |
|---|---|---|---|---|
| 2021/0088811 A1* | 3/2021 | Varady | .................... | G06V 10/44 |
| 2022/0291527 A1* | 9/2022 | Petty | ........................ | A61F 9/029 |
| 2023/0113713 A1* | 4/2023 | Lindauer | ................ | B33Y 50/02 |
| | | | | 703/1 |
| 2023/0153479 A1* | 5/2023 | Bradley, Sr. | ........... | G02C 7/028 |
| | | | | 703/1 |

* cited by examiner

*Primary Examiner* — Michael J Brown
(74) *Attorney, Agent, or Firm* — RC Trademark Company

(57) ABSTRACT

According to some embodiments, a method for manufacturing custom eyewear is disclosed. The method includes receiving, via a processor, a selection of (i) an eyewear front design and (ii) an eyewear bridge design from a user. A plurality of facial measurements is also received from the user. Eyewear specifications are determined, via the processor, based on the received eyewear front design, the eyewear bridge design, and the plurality of facial measurements. The eyewear specifications are converted into a file associated with computer-aided manufacturing and the file is transmitted, via the processor, to a manufacturing and assembly system for creating custom eyewear based on the file.

14 Claims, 4 Drawing Sheets

100

---

Receive a selection of (i) an eyewear front design and (ii) an eyewear bridge design from a user   102

↓

Receive a plurality of facial measurements from the user   104

↓

Determine eyewear specifications based on the received eyewear front design, the eyewear bridge design, and the plurality of facial measurements   106

↓

Convert the eyewear specifications into a file associated with computer-aided manufacturing   108

↓

Transmit the file to a manufacturing and assembly system for creating custom eyewear based on the file   110

FIG. 1

CUSTOM EYEWEAR MANUFACTURING SYSTEM

BACKGROUND

Buying eyewear is often a confusing process as there are a variety of styles, shapes, and sizes of eyewear and for the consumer, it can take a great length of time to find eyewear that both fits your style and fits your face. Often, consumers must compromise to find a size and style they can live with. Therefore, a system that provides more options regarding size and style of eyewear to a consumer would be desirable.

SUMMARY

Some embodiments described herein relate to a system and method for manufacturing custom eyewear. The method and system include receiving, via a processor, a selection of (i) an eyewear front design and (ii) an eyewear bridge design from a user. A plurality of facial measurements is also received from the user. Eyewear specifications are determined, via the processor, based on the received eyewear front design, the eyewear bridge design, and the plurality of facial measurements. The eyewear specifications are converted into a file associated with computer-aided manufacturing and the file is transmitted, via the processor, to a manufacturing and assembly system for creating custom eyewear based on the file.

BRIEF DESCRIPTION OF THE DRAWING

FIG. 1 illustrates a system in accordance with some embodiments.

DETAILED DESCRIPTION

Figure 2:
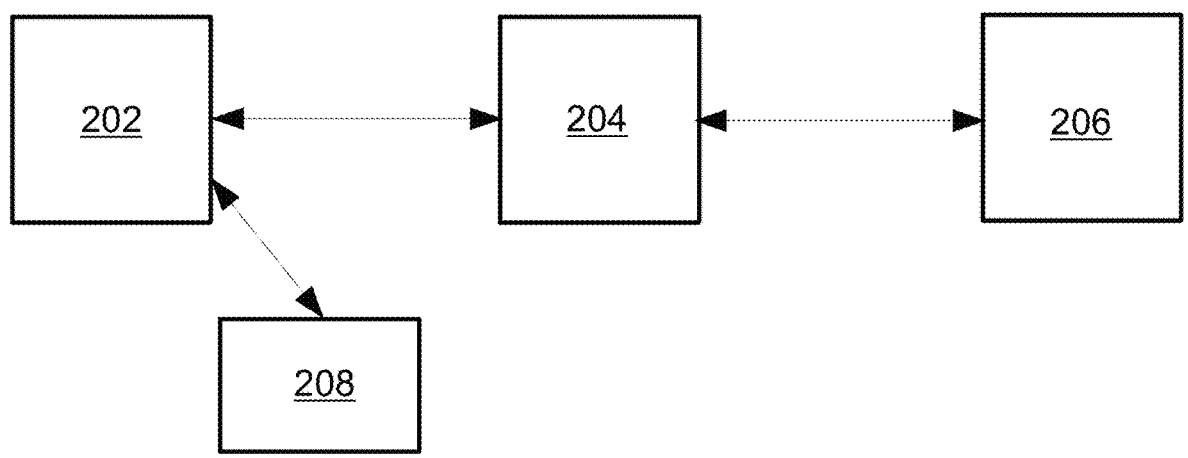
FIG. 2 illustrates a method in accordance with some embodiments.

In the following detailed description, numerous specific details are set forth in order to provide a thorough understanding of the embodiments. However, it will be understood by those of ordinary skill in the art that the embodiments may be practiced without these specific details. In other instances, well-known methods, procedures, components, and circuits have not been described in detail so as not to obscure the embodiments.

Now referring to FIG. 1, a method 100 that might be performed by a custom eyewear manufacturing system is illustrated. The method described herein does not imply a fixed order to the steps, and embodiments of the present invention may be practiced in any order that is practicable. Note that any of the methods described herein may be performed by hardware, software, or any combination of these approaches. For example, a non-transitory computer-readable storage medium may store thereon instructions that when executed by a machine result in performance according to any of the embodiments described herein.

Method 100 may relate to a method of creating custom eyewear for a user (e.g., a customer or consumer) where the eyewear is designed by the user and then automatically manufactured. Now referring to 102, a selection of (i) an eyewear front design and (ii) an eyewear bridge design may be received from a user. The eyewear front design may comprise a front shape of the eyewear. For example, the front design may be, but is not limited to, a variety of shapes such as, but not limited to, round, square, rectangle, or oval shaped eyewear as known in the art. The eyewear front design may also comprise a variety of designs, colors, or other decorative features. The selection of an eyewear bridge design may comprise a selection of portion of eyewear that sits over the user's nose. The bridge design may vary in thickness, height, width (e.g., for a fat or skinny nose), an angle of the opening, as well a curved, straight, or angled surface that contacts the user's nose.

The selection of the (i) eyewear front design and (ii) eyewear bridge design may be made from a digital catalog of eyewear front designs and bridge designs where the user selects predefined (i) eyewear front design and (ii) eyewear bridge design that are stored in a database. Based on the selection, specifications of the selected eyewear may be retrieved from the database. In some embodiments, the user may simply enter in ornamental features associated with the (i) eyewear front design and (ii) eyewear bridge design and an eyewear selection may be retrieved from the database. The ornamental features may include shapes, ratios of height to length, color, thickness, etc. In some embodiments, the (i) eyewear front design and (ii) eyewear bridge design may be selected from an online catalog comprising unique identifiers associated with each (i) eyewear front design and (ii) eyewear bridge design. The user may then simply enter in that unique identifier and the specifications associated with the (i) eyewear front design and (ii) eyewear bridge design may be retrieved from the database. In some embodiments, temple designs may also be selected from the online catalog.

In some embodiments, a user may have access to physical samples of eyewear fronts, bridges, and temples so that the user can physically try on a variety of eyewear fronts, bridges, and temples. In some embodiments, a user may be able to combine various eyewear fronts, bridges and temples using temporary flexible connectors (e.g., plastic or rubber) to build a desired eyewear design. This allows a great deal of flexibility and options for a user in creating eyewear. Each front design, bridge and temple may be marked with a unique identifier corresponding to a respective design file stored in the database (e.g., a CAD file) that would be sent to a manufacturing and assembly system for production. Thus, in use, a user may simply try on a variety of eyewear fronts, bridges and temples and then enter the unique identifiers into the user device to have their custom eyewear built. The information for each of the selected eyewear front, bridge and temple may be stored in a file (e.g., DXF file) and sent to computer-aided manufacturing (CAM) software that can import the file to begin production of the selected eyewear front, bridge, and temple. The manufactured eyewear front, bridge and temple may then be assembled.

For purposes of illustrating features of the present embodiments, an example will now be introduced and referenced throughout the disclosure. Those skilled in the art will recognize that this example is illustrative and is not limiting and is provided purely for explanatory purposes. Turning now to FIG. 2 an example of a custom eyewear manufacturing system 200 is illustrated. The system 200 may comprise a user device 202 for a user to enter information about desired custom eyewear. The user device 202 may comprise a computer or laptop or other network capable device. The user device 202 may reside remotely from other elements of the system 200 so that kiosks or other stores may access a same custom eyewear manufacturing system 200. The user device 202 may transmit the information about a custom eyewear selection to a controller 204.

Referring back to FIG. 1, a plurality of facial measurements associated with the user may be received. The facial measurements may comprise, but is not limited to, a distance between pupils, a desired frame width for the user's face, a bridge size (e.g., width), an ear position, and temple length to ear curve. These measurements may be manually entered by the user or may be received electronically from a wearable measuring device.

Referring back to FIG. 2, the user may manually enter a plurality of facial measurements into user device 202. In some embodiments, the user may wear an eyewear measuring device 208 (i.e., a model eyewear device) that comprises movable portions (e.g., moveable arms to determine temple length, movable front portion to determine frame width and an adjustable bridge to determine bridge size) to properly fit the eyewear to the user's face. In some embodiments, the movable portions may be able to lock in place so that the user may be able to read the measurements from the movable portions and enter those measurements manually into the user device 202. However, in some embodiments, the eyewear measuring device 208 may comprise sensors that transmit facial measures to the user device 208 once the user indicates that the eyewear fits properly (e.g., selects "enter"). Once the user device 202 receives the information from the eyewear measuring device, or manually entered from the user, the information may be transmitted to the controller 204.

Referring back to FIG. 1, eyewear specifications based on the received eyewear front design, the eyewear bridge design, and the plurality of facial measurements may be determined at 106. The determining may be made by a processor which then combines all of the received data into a storage structure such as, but not limited to a database, file, stack or array. The eyewear specifications stored in the storage structure may then be converted into a file associated with computer-aided manufacturing at 108. For example, the information may be formatted in a Drawing Exchange Format or Drawing Interchange Format file (e.g., DXF file). This file, may be transmitted, via the controller/processor, to a manufacturing and assembly system for creating custom eyewear based on the file at 110. In some embodiments the user device 202 and the controller 204 may comprise a same physical device using a same processor.

Referring to FIG. 2, a manufacturing and assembly system 206 may import/receive the file transmitted from the controller 204. The manufacturing and assembly system 206 may comprise a computer numerical control ("CNC") machine or a digital printer. In some embodiments, the manufacturing and assembly system 206 may run/execute Computer-aided manufacturing (CAM) software that can import a DXF file.

Figure 3:
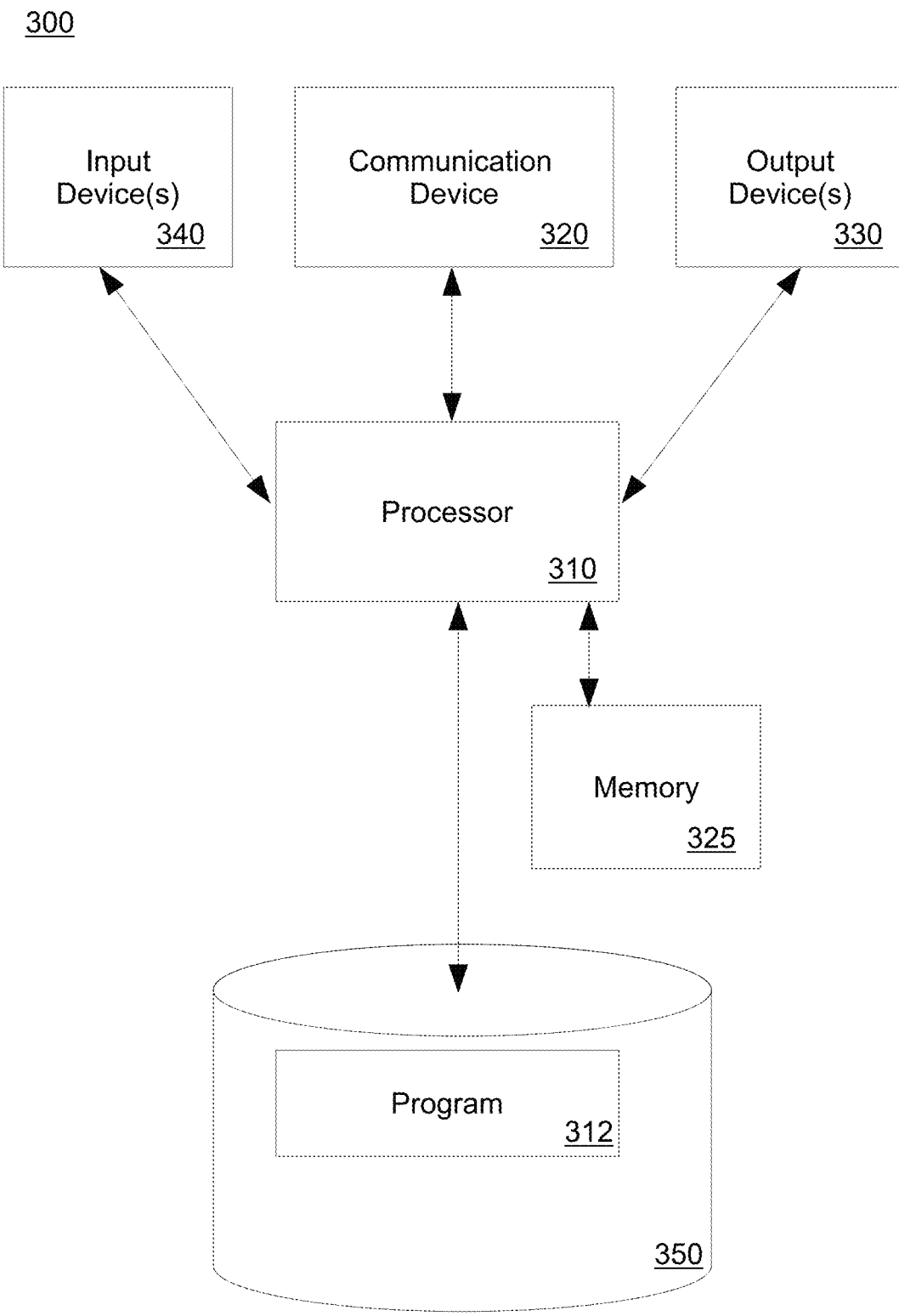
FIG. 3 illustrates a system in accordance with some embodiments.

The embodiments described herein may be implemented using any number of different hardware configurations or lens manufacturing machines. For example, FIG. 3 illustrates a controller 300 associated with a custom eyewear manufacturing system that may be, for example, associated with the method 100 of FIG. 1. The controller 300 of the custom eyewear manufacturing system may provide a technical and commercial advantage by being able to create more options for users as well as increase the speed of manufacturing.

The controller 300 may comprise a processor 310 ("processor"), such as one or more commercially available Central Processing Units (CPUs) in the form of one-chip microprocessors, coupled to a communication device 320 configured to communicate via a communication network (not shown in FIG. 3). The communication device 320 may be used to communicate, for example, with one or more machines on a network. The controller 300 further includes an input device 340 (e.g., a mouse and/or keyboard to enter information associated with custom eyewear) and an output device 330 (e.g., to output and display various eyewear designs to a user).

The processor 310 also communicates with a memory 325 and storage device 350 that stores data 313. The storage device 350 may comprise any appropriate information storage device, including combinations of magnetic storage devices (e.g., a hard disk drive), optical storage devices, mobile telephones, and/or semiconductor memory devices. The storage device 350 may store a program 312 for controlling the processor 310. The processor 310 performs instructions of the program 312 and thereby operates in accordance with any of the embodiments described herein. For example, the processor 310 may receive information associated with custom eyewear, display the eyewear on a screen (and in some embodiments over an image of the user) and may determine parameters to manufacture the customer eyewear via the instructions of the program 312.

The program 312 may be stored in a compiled, compressed, uncompiled and/or encrypted format or a combination. The program 312 may furthermore include other program elements, such as an operating system, a database management system, and/or device drivers used by the processor 310 to interface with peripheral devices.

Figure 4:
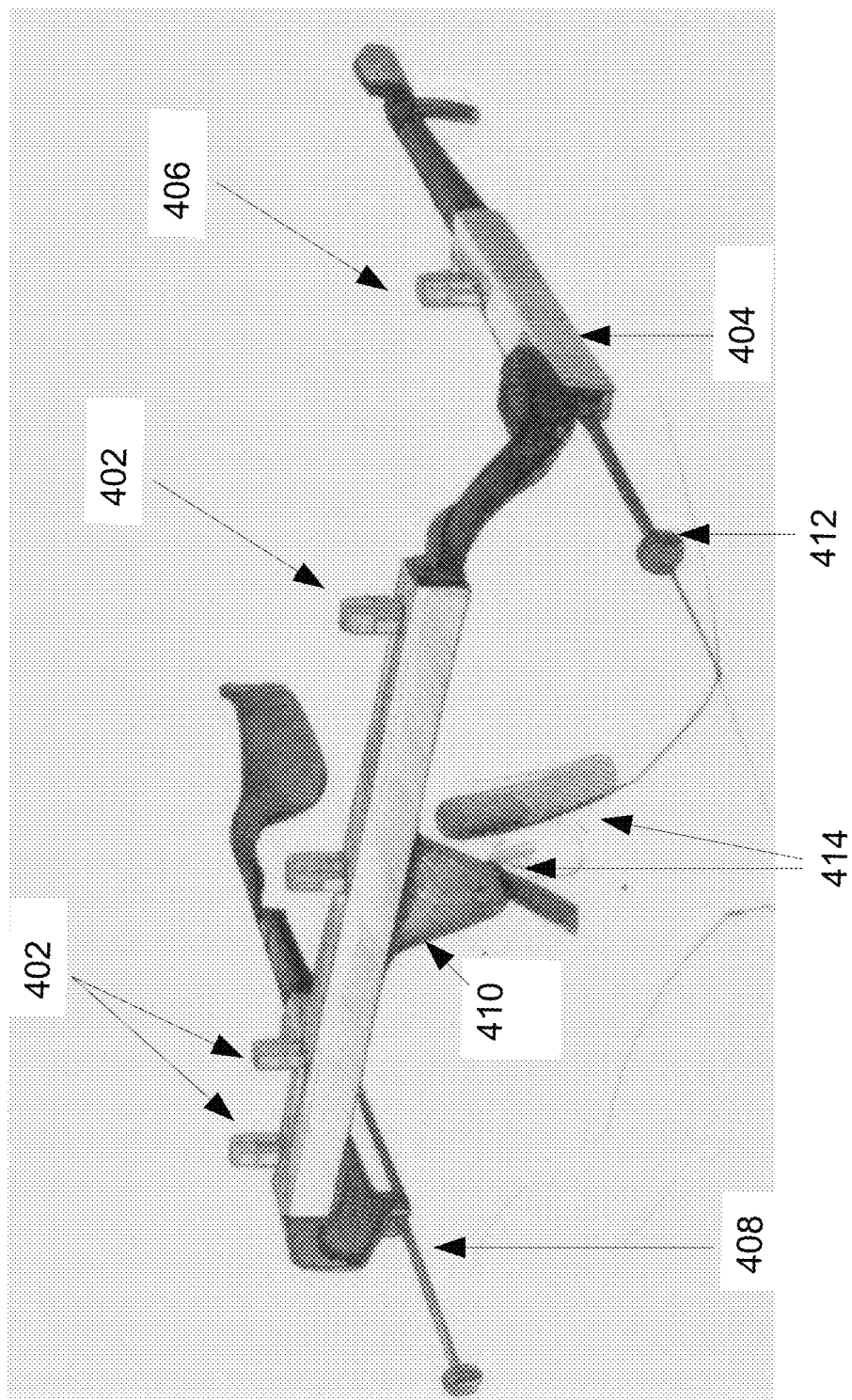
FIG. 4 illustrates a wearable eyewear measuring device in accordance with some embodiments.

Now referring to FIG. 4, an embodiment of a wearable eyewear measuring device 400 is disclosed. The wearable eyewear measuring device 400 comprises a plurality of moveable and adjustable parts so that a user can try on the wearable eyewear measuring device 400 and adjust it to fit the user's face. Once a proper fit is obtained, the wearable eyewear measuring device 400 can indicate to the user the desired measurements by the user reading one or more scale/rulers on the wearable eyewear measuring device 400 associated with the various required measurements or by having the wearable eyewear measuring device 400 transmit the measurements either wirelessly or via a wire to a user device.

In the present embodiment, the wearable eyewear measuring device 400 comprises a plurality of sliders 402 that move various parts of the wearable eyewear measuring device 400. Once the parts of the wearable eyewear measuring device 400 are in a desired position for the user, the user may lock each of the plurality of sliders 402 so that each of the plurality of sliders 402 are fixed in place. Each of the plurality of sliders 402 may comprise a sensor that reports a position of the slider 402 and, once locked, each of the plurality of sliders 402 may transmit its associated position to a user device such as user device 202 of FIG. 2. In some embodiments, the wearable eyewear measuring device 400 comprises scales/rulers such that the user can visually read a measurement once a slider 402 is locked in place. As illustrated in FIG. 4, the sliders 402 may adjust a width of the eyewear. In particular, the sliders 402 may adjust a right side and a left side of the eyewear, independently, to achieve a desired width. As illustrated, a bridge 410 may also be adjusted via variable side pieces 414 to adjust and/or capture a desired width of the bridge. A desired length of a temple 404 may be adjusted via slider 406. The temple will move back and forth and can also be moved using temple rod 412 which in some embodiments, may also be coupled to a bridge side piece 414 for proper alignment of the bridge and temple. A second temple rod 408 may be used to adjust a second temple of the custom eyewear.

As will be appreciated by one skilled in the art, the present embodiments may be embodied as a system, method, or computer program product. Accordingly, the embodiments described herein may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the embodiments described herein may take the form of a computer program product embodied in one or more computer readable medium(s) having computer readable program code embodied thereon.

The process flow and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein. The method steps can then be carried out using the distinct software modules and/or sub-modules of the system, as described above, executing on one or more hardware processors. Further, a computer program product can include a computer-readable storage medium with code adapted to be implemented to carry out one or more method steps described herein, including the provision of the system with the distinct software modules.

This written description uses examples to disclose multiple embodiments, including the preferred embodiments, and also to enable any person skilled in the art to practice the invention, including making and using any devices or systems and performing any incorporated methods. Aspects from the various embodiments described, as well as other known equivalents for each such aspects, can be mixed and matched by one of ordinary skill in the art to construct additional embodiments and techniques in accordance with principles of this application.

Those in the art will appreciate that various adaptations and modifications of the above-described embodiments can be configured without departing from the scope and spirit of the claims. Therefore, it is to be understood that the claims may be practiced other than as specifically described herein.

What is claimed:

1. A method of manufacturing custom eyewear, the method comprising:
   receiving, via a processor, a selection of (i) an eyewear front design and (ii) an eyewear bridge design from a user;
   receiving, via the processor, a plurality of facial measurements from the user;
   determining, via the processor, eyewear specifications based on the received eyewear front design, the eyewear bridge design, and the plurality of facial measurements;
   converting, via the processor, the eyewear specifications into a file associated with computer-aided manufacturing;
   transmitting the file, via the processor, to a manufacturing and assembly system for creating custom eyewear based on the file, wherein the plurality of facial measurements from the user comprises receiving the facial measurements from a wearable eyewear measuring device that transmits the plurality of facial measurements from the wearable eyewear measuring device to the custom eyewear manufacturing system.

2. The method of claim 1, wherein the file associated with computer-aided manufacturing comprises a vector file format to share drawing data between computer-aided design ("CAD") applications and third-party programs.

3. The method of claim 1, wherein the plurality of facial measurements comprises face width, bridge shape, ear position, and temple length to ear curve.

4. The method of claim 3, wherein the bridge shape is received from a user's selection of a bridge shape from a digital catalogue of eyewear bridges.

5. The method of claim 1, wherein the manufacturing and assembly system comprises a CNC machine or a 3D Printer.

6. A system for manufacturing custom eyewear, the system comprising:
   a processor;
   a 3d printer;
   a CNC machine; and
   a control system, comprising the processor, where the control system receives, via the processor, a selection of (i) an eyewear front design and (ii) an eyewear bridge design from a user, receives, via the processor, a plurality of facial measurements from the user, determines, via the processor, eyewear specifications based on the received eyewear front design, the eyewear bridge design, and the plurality of facial measurements, converts, via the processor, the eyewear specifications into a file associated with computer-aided manufacturing, and transmits the file, via the processor, to the 3D printer or CNC machine for creating custom eyewear based on the file, wherein the plurality of facial measurements from the user comprises receiving the facial measurements from a wearable eyewear measuring device that transmits the plurality of facial measurements from the wearable eyewear measuring device to the custom eyewear manufacturing system.

7. The method of claim 6, wherein the file associated with computer-aided manufacturing comprises a vector file format to share drawing data between computer-aided design ("CAD") applications and third-party programs.

8. The method of claim 6, wherein the plurality of facial measurements comprises face width, bridge shape, ear position, and temple length to ear curve.

9. The method of claim 8, wherein the bridge shape is received from a user's selection of a bridge shape from a digital catalogue of eyewear bridges.

10. A non-transitory computer readable medium, that when executed by a processor performs a method, the method comprising:
  receiving, via a processor, a selection of (i) an eyewear front design and (ii) an eyewear bridge design from a user;
  receiving, via the processor, a plurality of facial measurements from the user;
  determining, via the processor, eyewear specifications based on the received eyewear front design, the eyewear bridge design, and the plurality of facial measurements;
  converting, via the processor, the eyewear specifications into a file associated with computer-aided manufacturing;
  transmitting the file, via the processor, to a manufacturing and assembly system for creating custom eyewear based on the file, wherein the plurality of facial measurements from the user comprises receiving the facial measurements from a wearable eyewear measuring device that transmits the plurality of facial measurements from the wearable eyewear measuring device to the custom eyewear manufacturing system.

11. The method of claim 10, wherein the file associated with computer-aided manufacturing comprises a vector file format to share drawing data between computer-aided design ("CAD") applications and third-party programs.

12. The method of claim 10, wherein the plurality of facial measurements comprises face width, bridge shape, ear position, and temple length to ear curve.

13. The method of claim 12, wherein the bridge shape is received from a user's selection of a bridge shape from a digital catalogue of eyewear bridges.

14. The method of claim 10, wherein the manufacturing and assembly system comprises a CNC machine or a 3D Printer.

* * * * *